Figure 1:
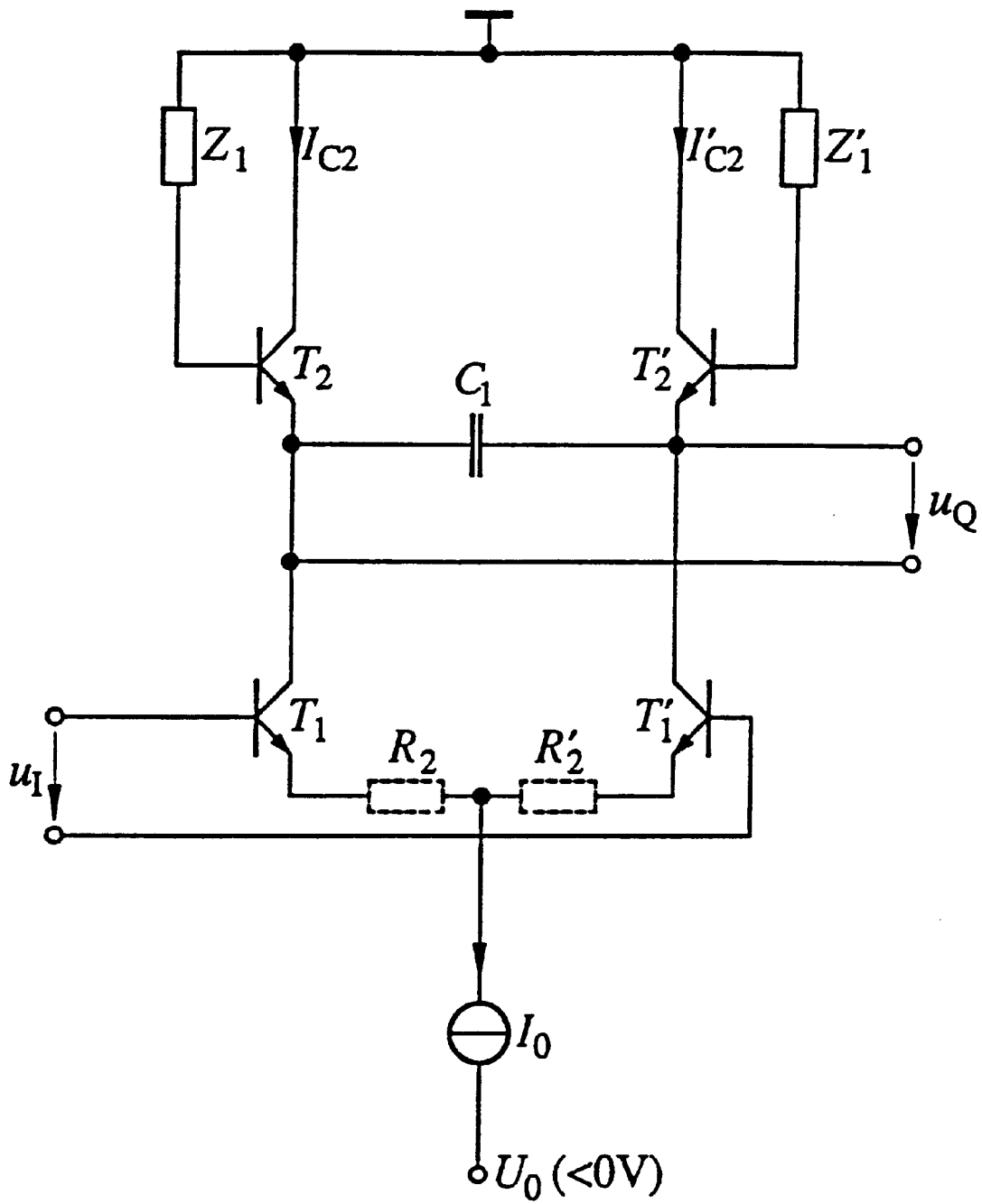

United States Patent

Schmidt

Patent Number: 5,949,295
Date of Patent: *Sep. 7, 1999

[54] INTEGRATABLE TUNABLE RESONANT CIRCUIT FOR USE IN FILTERS AND OSCILLATORS

[75] Inventor: Lothar Schmidt, Barsinghausen, Germany

[73] Assignee: Sican, Gesellschaft Fur Silizium-Anwendungen Und Cad/Cat Niedersachsen MbH, Germany

[*] Notice: This patent is subject to a terminal disclaimer.

[21] Appl. No.: 08/387,860
[22] PCT Filed: Jun. 28, 1994
[86] PCT No.: PCT/DE94/00734
  § 371 Date: May 15, 1995
  § 102(e) Date: May 15, 1995
[87] PCT Pub. No.: WO95/01671
  PCT Pub. Date: Jan. 12, 1995

[30] Foreign Application Priority Data

Jun. 29, 1993 [DE] Germany .................. P 43 21 565

[51] Int. Cl.⁶ .............. H03B 5/12; H03H 11/48
[52] U.S. Cl. ............ 331/117 R; 327/553; 327/557; 333/214; 331/177 R
[58] Field of Search .......... 331/117 R, 117 FE, 331/167, 177 R, 177 V; 333/213, 214, 215; 327/553, 557

[56] References Cited

U.S. PATENT DOCUMENTS 3,758,885  9/1973  Voorman et al. ............ 333/215
4,383,230  5/1983  Manzolini .................. 333/214
5,347,238  9/1994  Kobayashi ................. 331/117 R

FOREIGN PATENT DOCUMENTS 1120592  7/1968  United Kingdom.

Primary Examiner—Siegfried H. Grimm
Attorney, Agent, or Firm—Stein, Schifino & Van Der Wall

[57] ABSTRACT

A circuitry arrangement for a resonant circuit that may be completely monolithically integrated and electrically tuned has a differential amplifier stage with two transistors $T_1,T_1'$ fed by a constant current source $I_0$ that are differentially loaded at their collectors by a voltage-dependent capacity and inductively loaded in relation to the circuit ground by a pair of emitter followers $T_2,T_2'$ with electrically adjustable impedance that act upon the base. To implement the electrically adjustable impedances, transistors with associated resistances are provided (for example a pair of emitter followers $T_3,T_3'$ with base pre-resistances $R_1,R_1'$) which may be adjusted by control currents (for example $I_1,I_1'$). The voltage-dependant capacity is implemented by transistors $T_4,T_4'$ whose short-circuited emitters and collectors are connected so that the circuit node thus obtained is applied to the circuit ground through a voltage source $U_1$. This circuit arrangement may also be used in a controllable oscillator by interconnecting two resonant circuits in a loop. The output signal of the first resonant circuit is used to control the second resonant circuit and the output signal of the second resonant circuit is inverted and used to control the first resonant circuit. Thus, two signals may be tapped at the outputs of both resonant circuits. The frequency of said signals may be varied by a control voltage and their frequency-independent phase difference equals $\pi/2$. An advantageous implementation of such an oscillator is obtained by decoupling the output signals of both resonant circuits through two identical output drive stages.

17 Claims, 6 Drawing Sheets

INTEGRATABLE TUNABLE RESONANT CIRCUIT FOR USE IN FILTERS AND OSCILLATORS

In IC technology, the aim is to design as far as possible all circuit components in a completely monolithically integrated fashion, in order to avoid the arrangement of external components. However, this encounters difficulties in the case of large capacitances/inductances, in particular, so that compromises or incomplete solutions are frequently accepted.

Thus, circuit concepts are known for monolithically integrated LC bandpass filters in which the necessary inductances are realized as planar spiral inductors by means of aluminum tracks on the chip. Such inductors are, however, not electrically adjustable, on the one hand, and they are only of low quality on the other hand, because of their series resistance and owing to parasitic coupling capacitances (N. M. Nguyen, R. G. Meyer: "*Si IC-compatible inductors and LC passive filters*", IEEE Journal of Solid-State Circuits, Vol. 25, No. 4, August 1990, pages 1028–1031; N. M. Nguyen, R. G. Meyer: "*A Si bipolar monolithic RF bandpass amplifier*", IEEE Journal of Solid-State Circuits, Vol. 27, No. 1, January 1992, pages 123–127).

The aim of the invention is to specify a completely monolithically integrated, electrically adjustable resonant circuit which can be used, for example, as an adjustable bandpass filter or as a resonator for a controllable oscillator and which satisfies all the requirements of high-quality IC technology. The invention achieves this aim by means of the basic concept in accordance with patent claim 1 and the development of this basic concept in accordance with patent claims 2–8.

The invention proceeds from the consideration of generating the required inductances by transformation of impedances from the base circuit into the emitter circuit of suitably connected bipolar transistors, the frequency dependence of the current gain being utilized. The inductances realized in this way on the one hand have a higher quality as an advantage with respect to the known concept and, on the other hand they can be electrically adjusted in a wide frequency range. Moreover, the geometrical dimensions of such inductors are smaller than those of the planar spiral inductors.

The utilization of the frequency dependence of the current gain of the bipolar transistors to realize inductances by transformation of impedance renders it possible to realize electrically tunable inductors by means of which the center frequency of a resonant circuit can be adjusted. As a second essential feature, the attenuation of the resonant circuit is reduced by negative resistances on the basis of the finite quality of the inductances thus generated, these negative resistances likewise being produced on the basis of impedance transformations. The change in filter capacities which is produced simultaneously with the tuning of the inductors leads to a relationship between the electrical manipulated variable and the center frequency of the resonant circuit which is approximately linear over a wide range.

The resonant circuit according to the invention can be used directly as an active single-stage or multistage bandpass filter. However, it is possible to use the resonant circuit according to the invention with particular advantage to form a completely monolithically integrated, electrically adjustable oscillator such as is required for many applications, for example in the field of telecommunications.

Various concepts are known for such oscillators and can be classified into the three groups of relaxation oscillators, ring oscillators and LC oscillators.

Relaxation oscillators (for example, M. Soyuer, J. D. Warnock: "*Multigigahertz Voltage-Controlled Oscillators in Advanced Silicon Bipolar Technology*", IEEE Journal of Solid-State Circuits, Vol. 27, No. 4, April 1992, pages 668–670; J. G. Sneep, C. J. M. Verhoeven: "*A New Low-Noise 100-MHz Balanced Relaxation Oscillator*", IEEE Journal of Solid-State Circuits, Vol. 25, No. 3, June 1990, pages 692–698; A. A. Abidi, R. G. Meyer: "*Noise in Relaxation Oscillators*", IEEE Journal of Solid-State Circuits, Vol. 18, No. 6, December 1983, pages 794–802), in which a capacitor is alternately charged and discharged via an adjustable current, certainly have a wide frequency adjustment range, but have high phase noise because of the lack of frequency selectivity of the amplitude response of the ring gain, as a result of which such oscillators are greatly restricted in the extent to which they can be used in many applications, for example in mobile radio or in the field of optical data transmission.

For the same reason, ring oscillators, in which the oscillation frequency is adjusted via a variation in the operating time of a plurality of invertor stages connected to form a ring, cannot be used for applications which necessitate an oscillator placing high demands on spectral purity (A. W. Buchwald, K. W. Martin: "*High-Speed Voltage-Controlled Oscillator With Quadrature Outputs*", Electronics Letters, Vol. 27, No. 4, 14 February 1991, pages 309–310).

Circuit concepts for integrated LC oscillators (N. M. Nguyen, R. G. Meyer: "*A 1.8-GHz Monolithic LC Voltage-Controlled Oscillator*", IEEE Journal of Solid-State Circuits, Vol. 27, No. 3, March 1992, pages 444–450) based on the abovementioned LC bandpass filters, in which the required inductors are realized as planar spiral inductors by aluminum tracks on the chip are better with reference to spectral purity. However, these have the disadvantage, in turn, that on the one hand they are not electrically adjustable and on the other hand are only of low quality, because of the series resistance as well as owing to the coupling capacitances.

By contrast, in accordance with the invention, a controllable, completely monolithically integrated oscillator is realized by a ring circuit consisting of two identical LC bandpass filters with electrically adjustable center frequencies. The advantage of this concept with respect to known circuit concepts resides in that the realization of electrically adjustable oscillators with low phase noise is possible without external resonators. Owing to the interconnection of the oscillator from two LC bandpass filters with adjustable center frequency, it is possible to tap at the two bandpass filter outputs two signals which have a constant phase difference of $\pi/2$ independent of frequency, as a result of which the circuit can be used as a quadrature oscillator. Additional advantages result from this for some applications. However, it can also suffice to output only one of the two output signals of the two bandpass filters.

Figure 2:
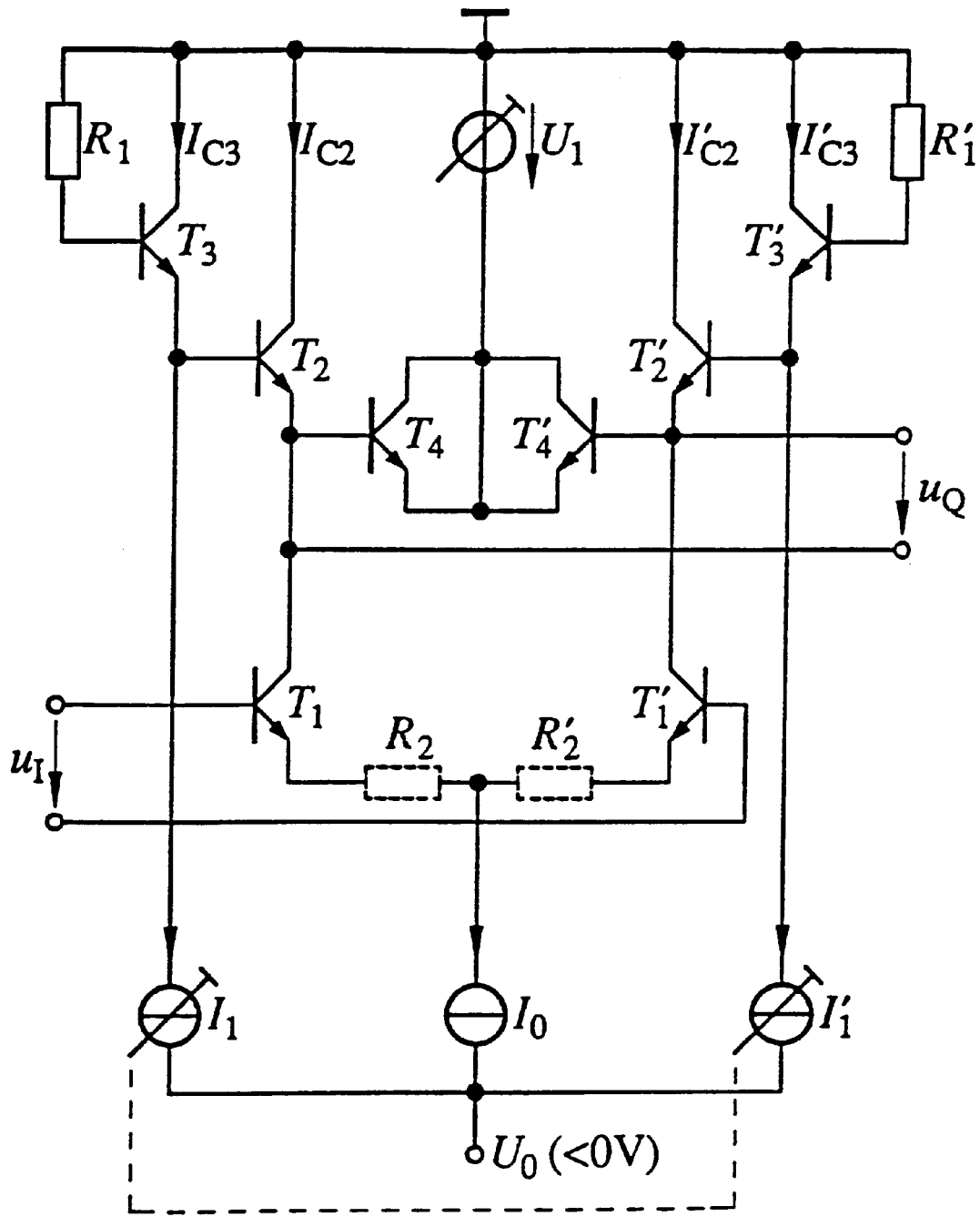
Figure 3:
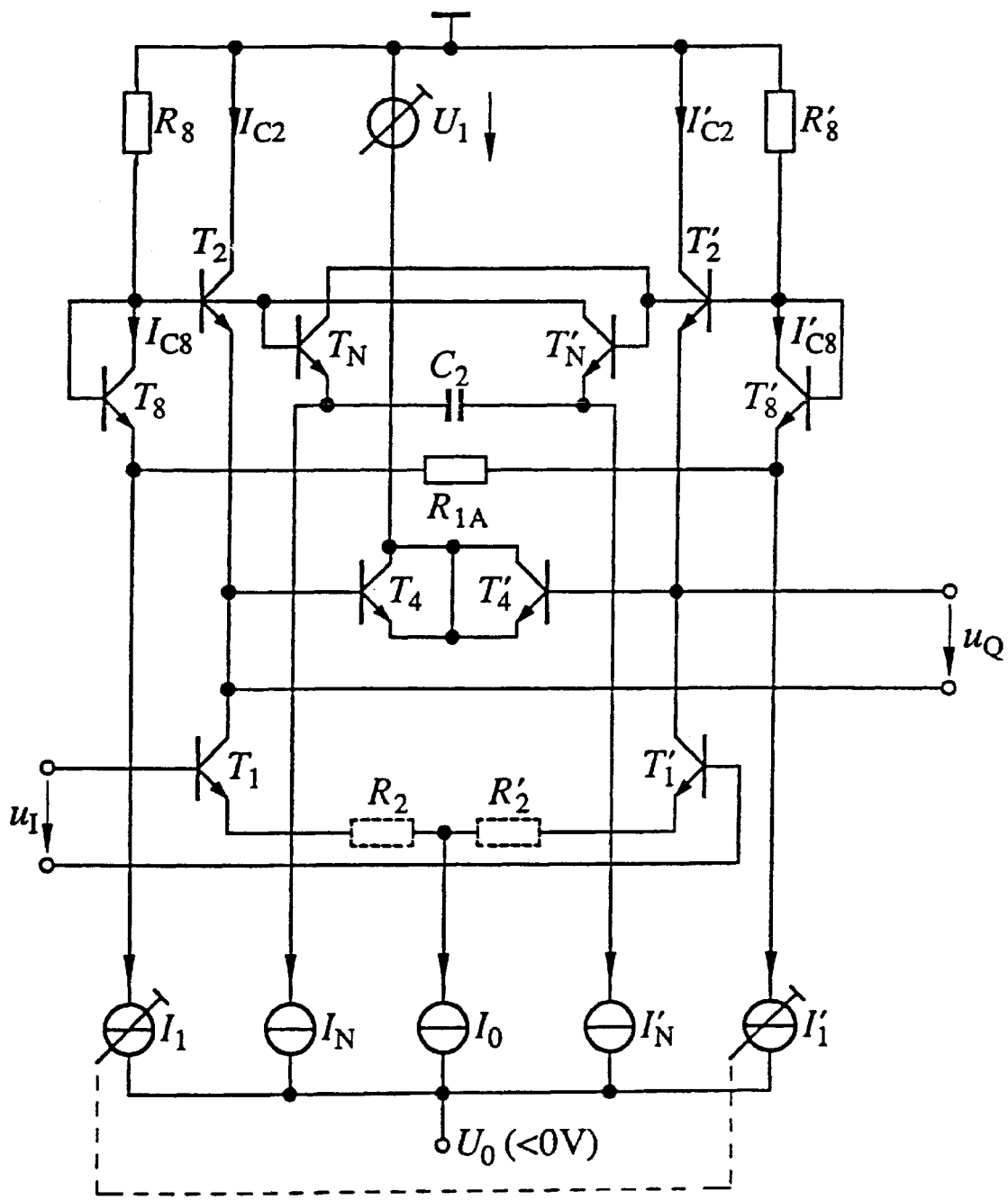
Figure 4:
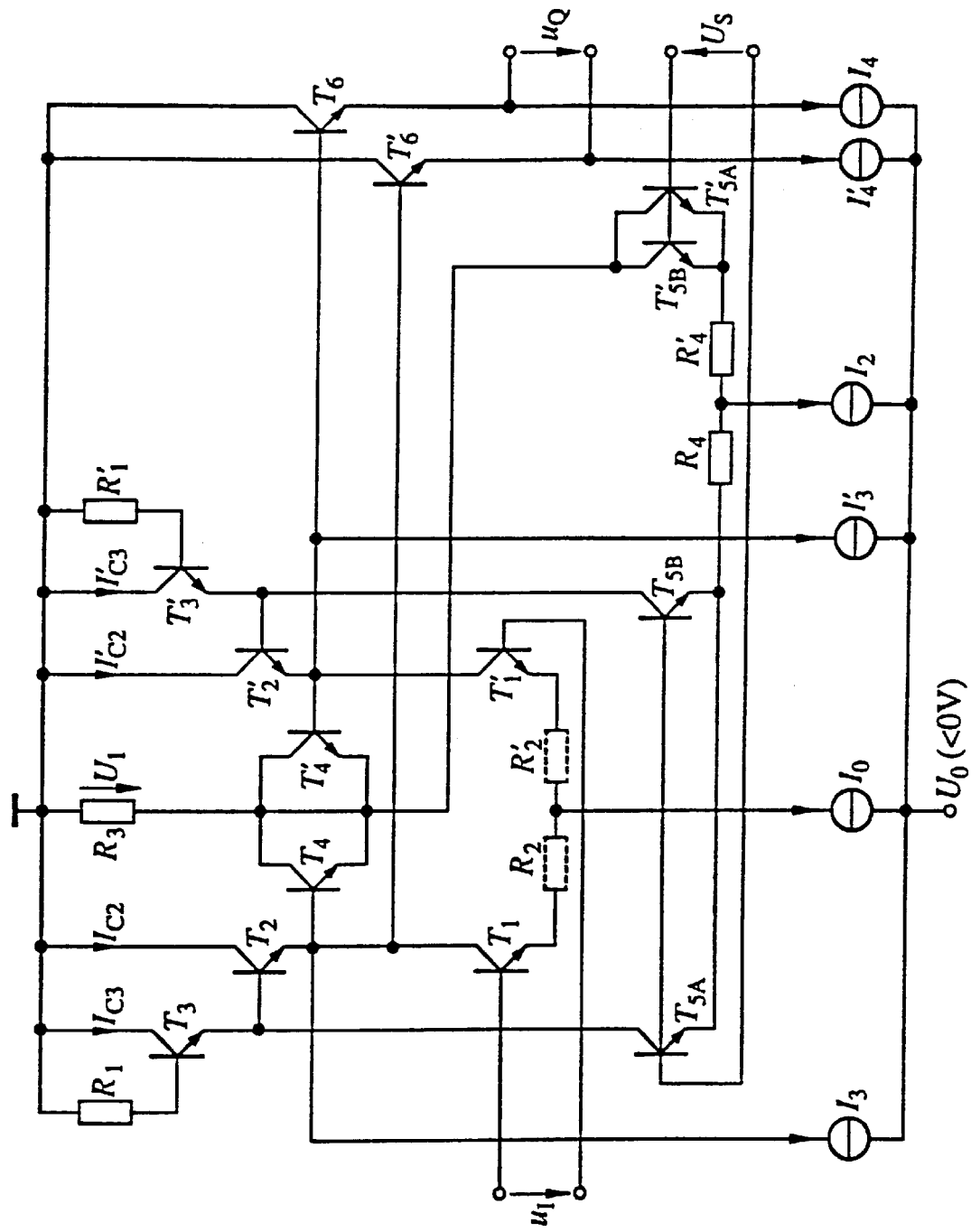
Figure 5:
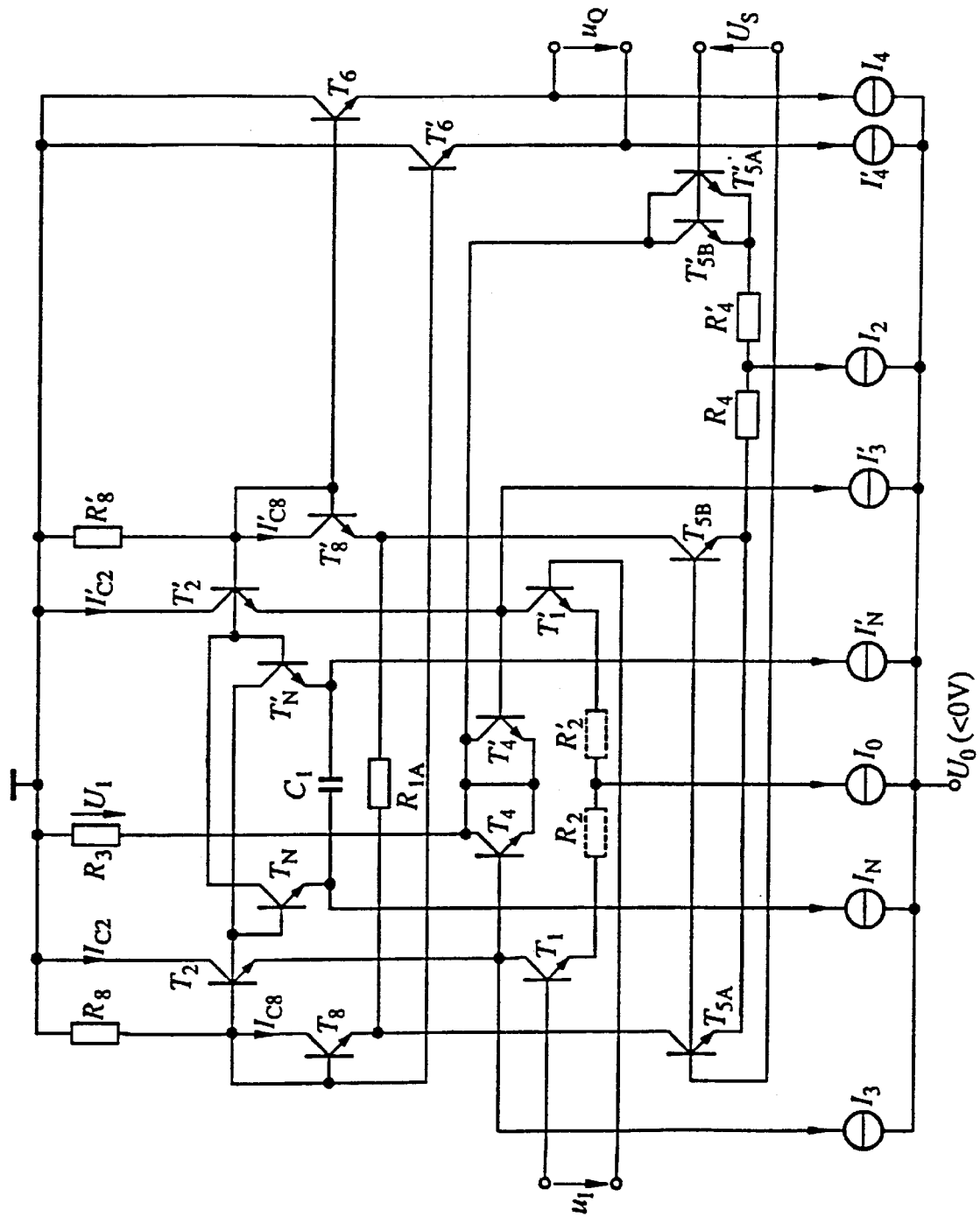
Figure 6:
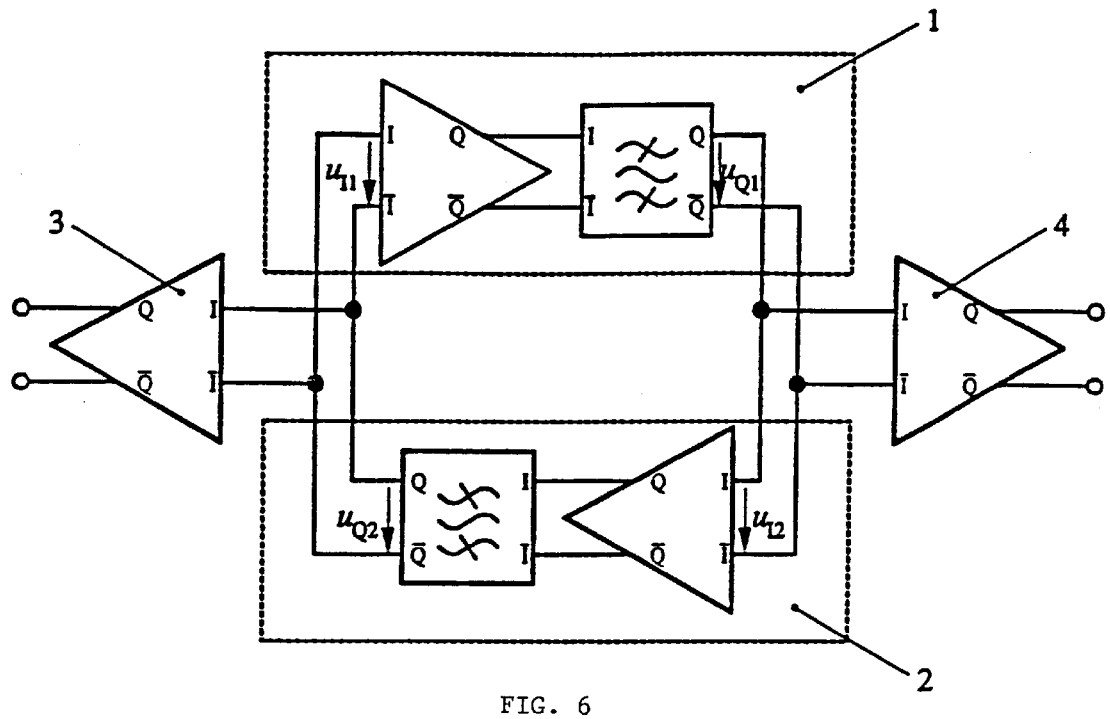
Figure 7:
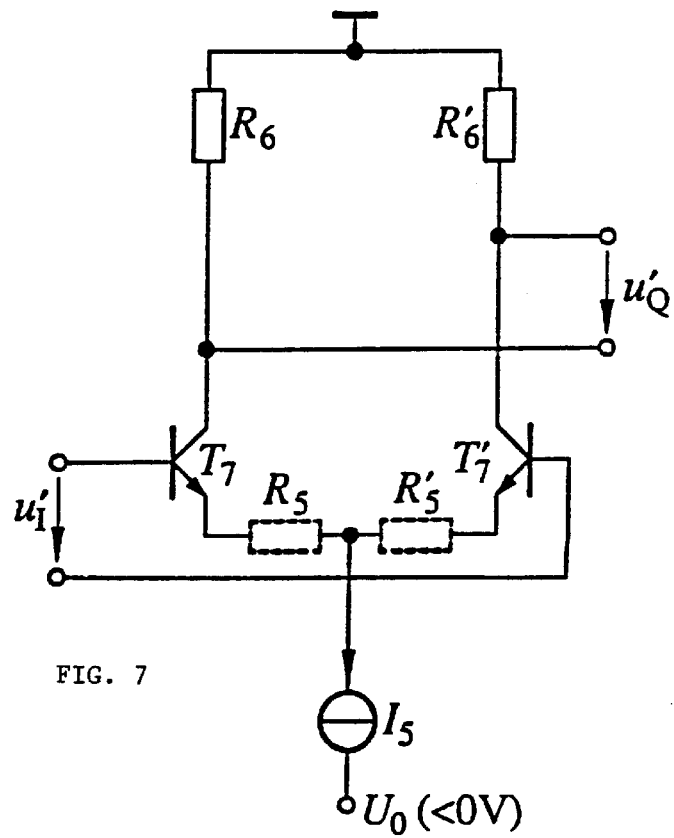

Exemplary embodiments of the invention are explained in more detail below with the aid of the drawings, in which:

FIG. 1 shows in diagrammatic form the basic concept of a resonant circuit according to the invention and having adjustable impedances, FIG. 2. shows a first example for realizing the adjustable impedances in the circuit in accordance with FIG. 1, FIG. 3 shows a second example for realizing the adjustable impedances in the circuit in accordance with FIG. 1, FIG. 4 an exemplary embodiment for an active bandpass filter, using the impedances realized in accordance with FIG. 2, FIG. 5 shows an exemplary embodiment for an active bandpass filter, using the impedances realized in accordance with FIG. 3, FIG. 6 shows the block diagram of an oscillator, formed with two bandpass filters in accordance with FIG. 2 or FIG. 3 and having quadrature outputs, and FIG. 7 shows an exemplary embodiment of one of the driver stages included in the oscillator in accordance with FIG. 6.

The basic structure of the resonant circuit according to the invention is represented in FIG. 1. A differential amplifier stage consisting of the two transistors $T_1$ and $T_1'$, which is fed by the constant source current $I_0$ has at the collectors of the said transistors an active load which consists of the transistors $T_2, T_2'$ operated in a common collector circuit (emitter follower), as well as of the impedances $Z_1, Z_1'$. For frequencies above the 3dB cut-off frequency of the current gain $\beta$ ($\beta$ cut-off frequency), this load represents an inductance with a series resistance to the extent that the impedances $Z_1, Z_1'$, have a real part $Re(Z_1)$ and $Re(Z_1')$, respectively, differing from zero. For frequencies above the $\beta$ cut-off frequency, the current gain $\beta$ can be approximated by the relationship $$\beta \equiv \frac{\omega_T}{j\omega} \text{ for } \omega > \omega_\beta = \omega_T / \beta_0 \qquad (1)$$

$\beta_0$ designating the current gain at low frequencies, $\omega$ the angular frequency, $\omega_\beta$ the 3 dB cut-off angular frequency of the current gain, and $\omega_T$ the transition angular frequency. The output resistance $r_A$ of a bipolar transistor operated in a common collector circuit (emitter follower) with impedance $Z_B$ acting on the base and a load $Z_E$ connected to the emitter is given by $$r_A \equiv \left(\frac{U_T}{I_C} + \frac{Z_B}{\beta}\right) \| Z_E \qquad (2)$$

$T_C$ designating the collector current and $U_T$ the thermal voltage. In accordance with (1) and (2), the output impedances $Z_{A2}$ and $Z_{A2}'$ of the transistors $T_2$ and $T_2'$ can be described at their emitter terminals by series circuits each composed of a resistor $R_S$ and an inductor L, the output impedances of the differential stage transistors $T_1$ and $T_1'$ being neglected ($Z_E \to \infty$, compare (2) ):

$$z_{A2} = z_{A2}' \equiv \frac{U_T}{I_{C2}} + j\omega Re\{Z_1\} - \frac{\omega}{\omega_T} Im\{Z_1\} = R_S + j\omega L \qquad (3)$$

The collector currents $I_{C2}$ and $I_{C2}'$ of the transistors $T_2$ and $T_2'$ amount on average to $0.5 \cdot I_0$ and can be regarded as constant for small drive levels. The quality of the inductor can be optimized by suitable dimensioning of the imaginary parts of $Z_1, Z_1'$ for the center angular frequency $\omega^0$ of the resonant circuit:

$$\frac{U_T}{I_{C2}} = \frac{U_T}{I'_{C2}} \stackrel{!}{=} \frac{\omega_0}{\omega_T} Im\{Z_1\} = \frac{\omega_0}{\omega_T} Im\{Z_1'\} \Rightarrow R_S = 0 \text{ for } \omega = \omega_0 \qquad (4)$$

The inductive load of the differential stage transistors produced in this way can be varied by adjusting the real parts of $Z_1, Z_1'$. The filter capacitor $C_1$ required to realize a bandpass filter is connected differentially between the collectors of the differential stage transistors $T_1, T_1'$.

As represented in FIG. 2, it is possible, for example, to use emitter followers $T_3, T_3'$ with base bias resistors $R_1, R_1'$ in order to realize the impedances $Z_1, Z_1'$ with electrically adjustable real parts. The output impedance $z_{A3}$ of the transistors $T_3$ and $T_3'$ is calculated at their emitters by (1) and (2) to be:

$$z_{A3} \equiv \frac{U_T}{I_{C3}} + j\omega \frac{R_1}{\omega_t} = Re\{Z\} + jIm\{Z\} \qquad (5)$$

the low loading of the transistors being negligible owing to the high input impedances of the transistors $T_2, T_2'$ and to the likewise high output impedances of the current sources $I_1, I_1'$, that is to say it is assumed that $Z_E \to \infty$ (compare (2) ). The quality of the inductor can be optimized in accordance with (4) by suitable selection of the imaginary part of Z, that is to say by the dimensioning of $R_1, R_1'$, for the center angular frequency of the resonant circuit, that is to say $\omega = \omega_0$:

$$\frac{U_T}{I_{C2}} = \frac{U_T}{I'_{C2}} \stackrel{!}{=} \frac{\omega_0^2 \cdot R_1}{\omega_T^2} \Rightarrow R_S = 0 \text{ for } \omega = \omega_0 \qquad (6)$$

The inductive load of the differential stage transistors $T_1, T_1'$ produced in this way is inversely proportional to the collector current of the transistors $T_2, T_3'$. The filter capacitor between the collectors of the differential stage transistors $T_1, T_1'$ is realized by means of the base-collector- and the base-emitter-depletion layer capacitances of the transistors $T_4, T_4'$.

Both the voltage dependence of the filter capacitance and the current dependence of the inductive load are used to detune the center frequency of the bandpass filter by varying $U_1$ and $I_1, I_1'$. The bandpass output signal $U_Q$ can be tapped at the collectors of the differential stage transistors $T_1, T_1'$.

A second variant for realizing the impedances $Z_1, Z_1'$ by means of electrically adjustable real parts is represented in FIG. 3. This variant is particularly advantageous in the case of low operating voltages such as, for example, in battery operation. The impedances $Z_1, Z_1'$ are realized here by a circuit comprising the resistors $R_8, R_8'$, the transistors $T_8$ and $T_8'$, connected as diodes, the adjustable current sources $I_1$ and $I_1'$, the resistor $R_{1A}$, the transistors $T_N$ and $T_{N'}$, the current sources $I_N$ and $I_N'$ and the capacitor $C_2$. The impedances can be calculated as follows taking account of (1) and (2):

$$Z_1 = Z_1' \equiv \left(\left(\frac{U_T}{I_{C8}} + \frac{R_{1A}}{2}\right) \| R_8\right) \| \left(\frac{-\omega T}{C_2(\omega_T^2 + \omega^2)} + \frac{-1}{j2\omega C_2}\left(\frac{\omega_T^2 - \omega^2}{\omega_T^2 + \omega^2}\right)\right) \qquad (5)$$

The inductive load of the differential stage transistors $T_1, T_1'$ generated in this way is a function of the collector current of the transistors $T_8, T_8'$. The filter capacitance between the collectors of the differential stage transistors $T_1, T_1'$ is, in turn, realized by means of the base-collector- and the base-emitter- depletion layer capacitances of the transistors $T_4, T_4'$. The capacitance of the capacitor $C_2$ can be optimized for $\omega = \omega_0$ in order to deattenuate the bandpass filter.

As in the example of FIG. 2, here, as well, both the voltage dependence of the filter capacitance and the current dependence of the inductive load are used to detune the center frequency of the bandpass filter by varying $U_1$ and $I_1$, $I_1'$. The bandpass output signal $U_Q$ can be tapped at the base terminals of the emitter followers $T_2, T_2'$.

An advantageous embodiment of a bandpass filter based on the basic structure realized in accordance with FIG. 2 is represented in FIG. 4. The bandpass filter comprises in essence the basic structure represented in FIG. 2, the adjustment of the current-dependent inductances and of the voltage-dependent capacitances being realized as a function of the control voltage $U_s$ by means of a feedback differential amplifier stage which consists of the transistors $T_{5A}, T_{5B}, T_{5A}', T_{5B}'$ and the resistors $R_4, R_4'$ and which is fed by the constant current source $I_2$. Owing to the additional constant currents $I_3, I_3'$, the collector currents $I_{C2}$ and $I_{C2}'$ of the transistors $T_2$ and $T_2'$ amount on average to $0.5 \cdot I_0 + I_3$ and $0.5 \cdot I_0 + I_3'$, respectively. With $I_3 = I_3' >> I_0$, the inductances become independent of the drive level of the feedback differential amplifier stage comprising $T_1, T_1'$ and $R_2, R_2'$.

For level adaptation and decoupling, the bandpass output signal $u_Q$ is tapped at the collectors of the differential stage transistors $T_1, T_1'$ via the emitter followers $T_6, T_6'$, which are fed from the constant current sources $I_4, I_4'$.

An embodiment of a bandpass filter based on the basic structure realized in accordance with FIG. 3 which is particularly advantageous for low operating voltages is represented in FIG. 5. Just as in the case of the exemplary embodiment in accordance with FIG. 4, here the adjustment of the current-dependent inductances and of the voltage-dependent capacitances is realized as a function of the control voltage $U_s$ by means of a feedback differential amplifier stage which comprises the transistors $T_{5A}, T_{5B}, T_{5A}', T_{5B}'$ and the resistors $R_4, R_4'$ and is fed by the constant current source $I_2$.

The additional constant currents $I_3, I_3'$ have the same effect as in the exemplary embodiment in accordance with FIG. 4. For the purpose of level adaptation and decoupling, the bandpass output signal $U_Q$ is tapped at the base terminals of the load transistors $T_2, T_2'$ via the emitter followers $T_6, T_6'$, which are fed from the constant current sources $I_4, I_4'$.

The circuits in accordance with FIG. 4 and FIG. 5 can be used both as single-stage adjustable bandpass filters and, by cascading a plurality of stages, as multistage adjustable bandpass filters, it being possible to additionally enhance the quality of the multistage bandpass filters by mutually detuning the center frequencies of the cascaded filter stages (so-called "staggered tuning").

In the exemplary embodiment in FIG. 6, two active bandpass filters 1, 2 having differential inputs and outputs are connected to form a ring in such a way that the active bandpass filter 2 is driven by the output signal of the active bandpass filter 1, the non-inverting output Q of the active bandpass filter 1 driving the non-inverting input I of the active bandpass filter 2, and the inverting output $\overline{Q}$ of the active bandpass filter 1 driving the inverting input $\overline{I}$ of the active bandpass filter 2. By contrast, the active bandpass filter 1 is driven in an inverted fashion by the output signal of the bandpass filter 2 owing to the fact that the non-inverting output Q of the active bandpass filter 2 is connected to the inverting input I of the active bandpass filter 1, and the inverting output $\overline{Q}$ of the active bandpass filter 2 is connected to the non-inverting input I of the active bandpass filter 1.

In the case of the resonant frequency, the bandpass filter output signals are phase-shifted with respect to the respective bandpass filter input signals by $-\pi/2$. Owing to the inversion in the case of driving the active bandpass filter 1 by the output signal of the active bandpass filter 2, which corresponds to an additional phase rotation of $-\pi$, the phase in the ring circuit is rotated overall by $2\pi$, that is to say the positive feedback required for the oscillation is achieved. The amplitude condition required over and above this is fulfilled owing to the fact that the gain of the active bandpass filter is greater than one.

In accordance with FIG. 6, the output signals are advantageously tapped via two output drivers 3, 4. As a result, the load capacity of the oscillator is increased and decoupling of the load to be driven is achieved. An exemplary embodiment for suitable driver stages is represented in FIG. 7. Together with the negative-feedback resistors $R_5, R_5'$, the transistors $T_7, T_7'$ form a differential stage which is loaded by the load resistors $R_6, R_6'$, the output signals $u_{Q1}$ and $u_{Q2}$ of the bandpass filters being used as driving signals of the driver stages. If no quadrature output signals are required, the use of an individual output driver which is driven by one of the two bandpass filters is sufficient.

I claim:

1. Monolithically integrated, tunable resonant circuit containing a differential amplifier stage having two transistors $T_1, T_1'$ which are fed from a constant current source $I_0$ and are loaded inductively with respect to the circuit ground at their collectors by means of an emitter follower pair $T_2, T_2'$ having electrically adjustable impedances $Z_1, Z_1'$ which act on a base of the transistors $T_2, T_2'$ and simulate inductances by impedance transformation via the transistors $T_2, T_2'$ wherein impedance $Z_1$ acts on the base of $T_2$ and impedance $Z_1'$ acts on the base of $T_2'$, a voltage-dependent capacitor $C_1$ being connected between the collectors of the differential stage transistors $T_1, T_1'$.

2. Resonant circuit according to claim 1, characterized in that the impedance $Z_1, Z_1'$ are simulated by emitter followers $T_3, T_3'$ which are provided with base bias resistors $R_1, R_1'$ and the emitter followers $T_3, T_3'$ can be adjusted via control currents $I_1, I_1'$ applied to the emitter terminals of the emitter followers $T_3, T_3'$.

3. Resonant circuit according to claim 1, characterized in that the impedances $Z_1, Z_1'$ are simulated by two transistors $T_8, T_8'$ which are connected as diodes and have assigned resistors $R_8, R_8'$ wherein the internal resistance of resistors $R_8, R_8'$ can be adjusted via control currents $I_1, I_1'$, as well as by two further transistors $T_N, T_N'$ which can be adjusted via control currents $I_N, I_N'$ and are situated between the bases of the emitter follower pair $T_2, T_2'$ the emitter terminals of the transistors $T_8, T_8'$ being interconnected by a resistor $R_{1A}$ and the emitter terminals of the transistors $T_N, T_N'$ being interconnected by a capacitor $C_2$.

4. Resonant circuit according to claim 1, characterized in that the voltage-dependent capacitance $C_1$ is formed by two transistors $T_4, T_4'$ whose respectively short-circuited emitters and collectors are connected at a circuit node, and are connected by means of this circuit node to the circuit ground via a voltage source $u_1$.

5. Resonant circuit according to claim 1, characterized in that the linearity range of an input voltage $u_I$ of the differential amplifier stage with the transistors $T_1, T_1'$ is increased by two negative-feedback resistors $R_2, R_2'$.

6. Resonant circuit according to claim 1 characterized in that a pair of control currents $I_1, I_1'$ are generated from a constant-current source $I_2$ by means of a differential amplifier stage having four transistors $T_{5A}, T_{5B}, T_{5A}', T_{5B}'$ and two negative-feedback resistors $R_4, R_4'$ as a function of a control voltage $U_s$, a voltage source $U_1$ being formed by a resistor $R_3$ at which a portion of the source current $I_2$ effects the voltage drop $U_1$ which serves to control voltage-dependent capacitances $T_4, T_4'$ which are connected at their respective bases to the emitter of $T_2$ and the emitter of $T_2'$.

7. Resonant circuit according claim 1, characterized in that an output signal $u_Q$ is tapped differentially via respective emitter terminals of an emitter follower pair composed of two transistors $T_6, T_6'$ which are connected by constant current sources $I_4, I_4'$ and which serve the purpose of decoupling and level reduction, $T_6$ being fed by $I_4$ and $T_6'$ being fed by $I_4'$, said emitter follower pair including bases which are respectively connected to the collectors of the two transistors $T_1, T_1'$ and collectors which are connected to ground.

8. Resonant circuit according to claim 1, characterized in that the emitter followers $T_2, T_2'$ are additionally fed with constant currents $I_3, I_3'$.

9. Circuit arrangement according to claim 1, characterized by using ECL technology.

10. Multistage bandpass filter consisting of a plurality of cascaded resonant circuits in accordance with claim 1.

11. Circuit arrangement according to claim 1, characterized by using $E^2CL$ technology.

12. Controllable oscillator consisting of two resonant circuits in accordance with claim 1, and wherein the two resonant circuits are connected to form a ring, the second resonant circuit having an output signal $u_{Q2}$ used in an inverted fashion to drive the first resonant circuit having an output signal $u_{Q1}$.

13. Oscillator according to claim 12, characterized in that the output signals $u_{Q1}$ and $u_{Q2}$ of the two resonant circuits (1) and (2) are decoupled by two identical output driver stages (3) and (4), each of these two output driver stages including a differential amplifier stage having two transistors $T_7, T_7'$ which are driven in a differential fashion between the base terminals by means of the signals $u_{Q1}$ and $U_{Q2}$, the differential amplifier stage being fed by a constant current source $I_5$, and the output signal $u'_Q$ being tapped in a differential fashion between a pair of load resistors $R_6, R_6'$ of the differential amplifier stages in each of the output driver stages.

14. Oscillator according to claim 13, characterized in that the linearity range of an input voltage $u_p$ of the differential amplifier stage having the transistors $T_7, T_7'$ is increased by two negative-feedback resistors $R_5, R_5'$.

15. Oscillator according to claim 12, characterized in that respective output signals $u_Q$ of the first and second resonant circuits, or respective output signals $U_Q'$ of the output driver stages have a constant phase difference of $\pi/2$ independent from frequency.

16. Oscillator according to claim 12, characterized in that only one of said $u_{Q1}$ and $u_{Q2}$ output signals of said respective first and second resonant circuits is output.

17. Oscillator according to claim 12, characterized in that the output signals $u_{Q1}$ and $u_{Q2}$ of the two resonant circuits (1) and (2) are decoupled by two identical output driver stages (3) and (4), each of these two output driver stages including a differential amplifier stage having two transistors $T_7, T_7'$ which are driven in a differential fashion between the base terminals by means of the signals $u_{Q1}$ and $u_{Q2}$, the differential amplifier stage being fed by a constant current source $I_5$, and the output signal being tapped in a single-phase fashion at resistors $R_6$ and $R_6'$ respectively, each relative to ground.

* * * * *